United States Patent
Ono et al.

(10) Patent No.: US 9,013,005 B2
(45) Date of Patent: *Apr. 21, 2015

(54) SEMICONDUCTOR DEVICE AND METHOD FOR MANUFACTURING SAME

(71) Applicant: Kabushiki Kaisha Toshiba, Tokyo (JP)

(72) Inventors: Syotaro Ono, Kanagawa (JP); Wataru Saito, Kanagawa (JP); Shunji Taniuchi, Kanagawa (JP); Miho Watanabe, Miyagi (JP); Hiroaki Yamashita, Tokyo (JP); Toshiyuki Naka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/032,007

(22) Filed: Sep. 19, 2013

(65) Prior Publication Data

US 2014/0015044 A1    Jan. 16, 2014

Related U.S. Application Data

(62) Division of application No. 13/235,302, filed on Sep. 16, 2011, now Pat. No. 8,592,917.

(30) Foreign Application Priority Data

Sep. 21, 2010 (JP) ................................. 2010-210476
Aug. 15, 2011 (JP) ................................. 2011-177584

(51) Int. Cl.
  *H01L 29/76*    (2006.01)
  *H01L 29/94*    (2006.01)
  (Continued)

(52) U.S. Cl.
  CPC ........ *H01L 29/7813* (2013.01); *H01L 29/0634* (2013.01); *H01L 29/42376* (2013.01); *H01L 29/4238* (2013.01); *H01L 29/0696* (2013.01); *H01L 29/1095* (2013.01)

(58) Field of Classification Search
  USPC ......... 257/396, 288, 213, 316, 318, 322, 329, 257/330, 387, 341, 401, E21.17, E21.177, 257/E21.396, E21.423, E21.421, E21.435, 257/E21.446, E21.477, E21.577
  See application file for complete search history.

(56) References Cited

U.S. PATENT DOCUMENTS 5,960,264 A   9/1999 Takahashi
6,740,931 B2  5/2004 Kouzuki et al.
(Continued)

FOREIGN PATENT DOCUMENTS

CN   1694265 A   11/2005
CN   1890813 A   1/2007
(Continued)

OTHER PUBLICATIONS

Chinese Office Action dated May 30, 2014, filed in Chinese counterpart Application No. 201110277760.3, 7 pages (with translation).
(Continued)

*Primary Examiner* — David Nhu
(74) *Attorney, Agent, or Firm* — Patterson & Sheridan, LLP

(57) ABSTRACT

According to an embodiment, a semiconductor device includes a second semiconductor layer provided on a first semiconductor layer and including first pillars and second pillars. A first control electrode is provided in a trench of the second semiconductor layer and a second control electrode is provided on the second semiconductor layer and connected to the first control electrode. A first semiconductor region is provided on a surface of the second semiconductor layer except for a portion under the second control electrode. A second semiconductor region is provided on a surface of the first semiconductor region, the second semiconductor region being apart from the portion under the second control electrode and a third semiconductor region is provided on the first semiconductor region. A first major electrode is connected electrically to the first semiconductor layer and a second major electrode is connected electrically to the second and the third semiconductor region.

6 Claims, 13 Drawing Sheets

(51) Int. Cl.
*H01L 31/062* (2012.01)
*H01L 31/113* (2006.01)
*H01L 31/119* (2006.01)
*H01L 29/78* (2006.01)
*H01L 29/06* (2006.01)
*H01L 29/423* (2006.01)
*H01L 29/10* (2006.01)

(56) References Cited

U.S. PATENT DOCUMENTS

| | | | |
|---|---|---|---|
| 7,259,426 B2 | 8/2007 | Aida et al. | |
| 8,592,917 B2 * | 11/2013 | Ono et al. | 257/396 |
| 2004/0007745 A1 | 1/2004 | Iinuma | |
| 2004/0012038 A1 | 1/2004 | Kouzuki et al. | |
| 2004/0084722 A1 | 5/2004 | Yamaguchi et al. | |
| 2004/0207009 A1 | 10/2004 | Yamaguchi et al. | |
| 2006/0006409 A1 | 1/2006 | Yamaguchi et al. | |
| 2007/0114570 A1 | 5/2007 | Yamaguchi et al. | |
| 2010/0102381 A1 | 4/2010 | Saito et al. | |

FOREIGN PATENT DOCUMENTS

| | | |
|---|---|---|
| JP | 2004-153112 A | 5/2004 |
| JP | 2005085990 | 3/2005 |
| JP | 2007115888 A | 5/2007 |
| JP | 2009141007 A | 6/2009 |
| JP | 2009194044 | 8/2009 |
| JP | 2010103337 A | 5/2010 |

OTHER PUBLICATIONS

Chinese Office Action dated Nov. 27, 2013, filed in Chinese counterpart Application No. 201110277760.3, 7 pages (with translation).
Taiwanese Office Action dated Nov. 21, 2013, filed in Taiwanese counterpart Application No. 100133227, 15 pages (with translation).
Japanese Office Action dated Jul. 28, 2014, filed in Japanese counterpart Application No. 2011-177584, 6 pages (with translation).

* cited by examiner

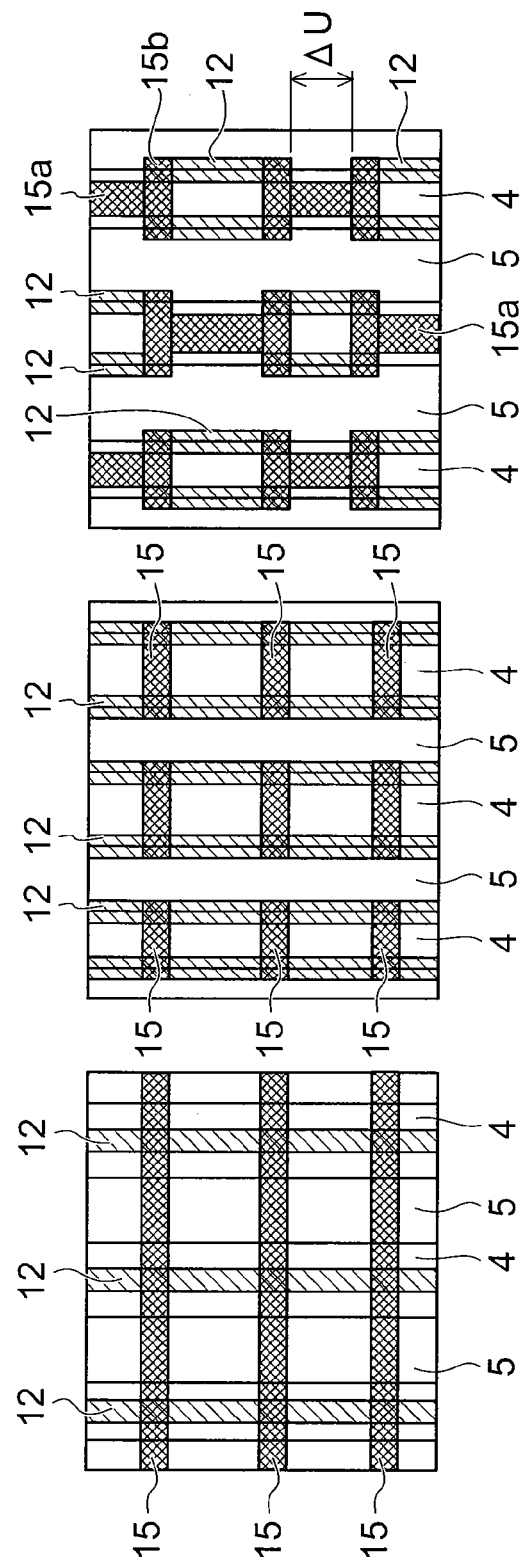

SEMICONDUCTOR DEVICE AND METHOD FOR MANUFACTURING SAME

CROSS-REFERENCE TO RELATED APPLICATIONS

This application is a divisional of U.S. patent application Ser. No. 13/235,302, filed on Sep. 16, 2011, which is based upon and claims the benefit of priority from Japanese Patent Application No. 2010-210476, filed on Sep. 10, 2010, and Japanese Patent Application No. 2011-177584, filed Aug. 15, 2011; the entire conents of which are incorporated herein by reference.

FIELD

Embodiments are generally related to a semiconductor device and a method for manufacturing the same.

BACKGROUND

A power semiconductor device such as a MOSFET (Metal Oxide Semiconductor Field Effect Transistor) or an IGBT (Insulated Gate Bipolar Transistor) has high-speed switching characteristics and a breakdown voltage of tens to hundreds of volt, and is widely used for electric power conversion and control in a home electric appliance, communication equipment, an in-car motor, and the like. Then, for improving efficiency and reducing power consumption in such equipment, the semiconductor device is being required to have characteristics of the high breakdown voltage and a low on-resistance. For example, in a semiconductor device that includes a super junction structure in which a p-type and n-type semiconductor layers are arranged alternately, it is possible to obtain both characteristics of the high breakdown voltage and the low on-resistance.

However, when a larger bias is applied to the super junction structure, there arises a problem in which p-n junction capacitance is abruptly reduced and the output capacitance of the semiconductor device is considerably changed. That is, the semiconductor device that includes the super junction structure has a large switching noise depending on the output capacitance. Accordingly, it is necessary to realize a semiconductor device that includes a super junction structure in which the output capacitance is increased to reduce the switching noise.

BRIEF DESCRIPTION OF THE DRAWINGS

FIGS. 11A to 11C are plan views illustrating gate electrode arrangements according to variations of the first embodiment;

DETAILED DESCRIPTION

Figure 1A:
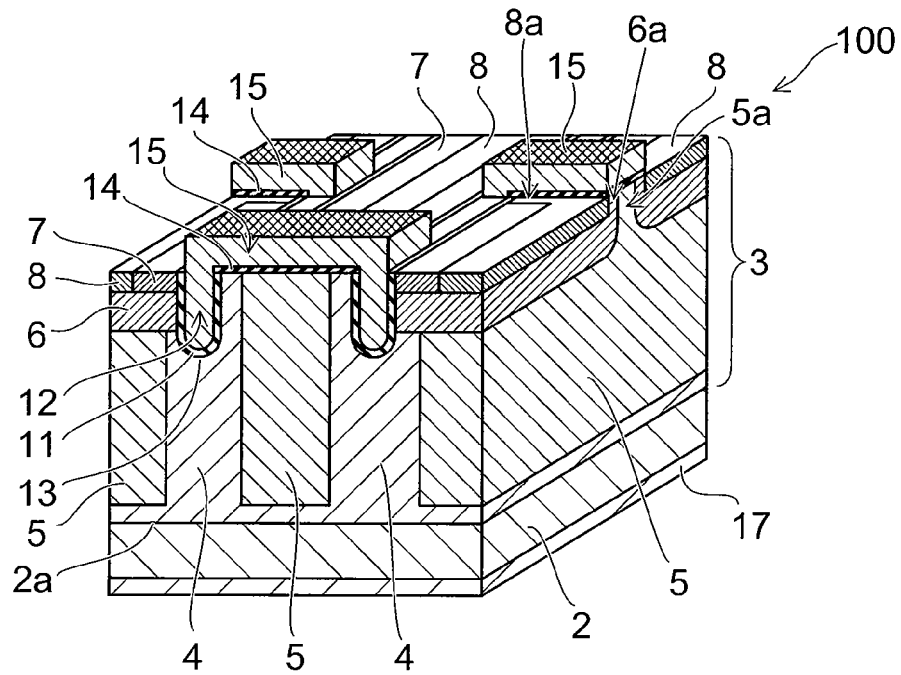
FIGS. 1A and 1B are schematic views illustrating a semiconductor device according to a first embodiment.

In general, according to an embodiment, a semiconductor device includes a first semiconductor layer having a first conductivity type and a second semiconductor layer provided on the first semiconductor layer and including first pillars of the first conductivity type and second pillars of a second conductivity type, the first pillars and the second pillars being provided alternately along a major surface of the first semiconductor layer. A first control electrode is provided in a trench via a first insulating layer, the trench being provided from a surface of the second semiconductor layer toward the first semiconductor layer and a second control electrode is provided on the second semiconductor layer via a second insulating layer and connected to the first control electrode. A first semiconductor region of the second conductivity type is provided on a surface of the second semiconductor layer except for a portion under the second control electrode. A second semiconductor region of the first conductivity type provided selectively on a surface of the first semiconductor region, the second semiconductor region being apart from the portion of the second semiconductor layer under the second control electrode and a third semiconductor region of the second conductivity type and provided selectively on the first semiconductor region by neighboring the second semiconductor region. A first major electrode is connected electrically to the first semiconductor layer and a second major electrode is connected electrically to the second semiconductor region and the third semiconductor region.

Embodiments of the invention will now be described with reference to the drawings. In the following embodiments, the same part in the drawing is denoted by the same reference number and detailed explanation thereof will be omitted appropriately and a different part will be explained. Although a first conduction type is explained as an n-type and a second conduction type as a p-type in the following embodiments, the first conduction type and the second conduction type may alternatively be the p-type and the n-type, respectively.

(First Embodiment)

Figure 1B:
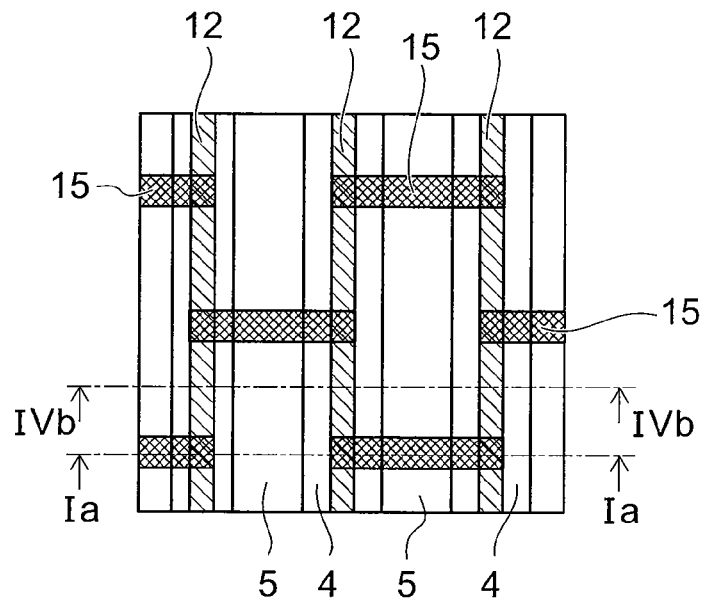

FIGS. 1A and 1B are schematic views showing a semiconductor device 100 according to the embodiment. FIG. 1A is a perspective view showing a cross-sectional structure, and FIG. 1B is a plan view showing an arrangement of gate electrodes 12 and 15. In FIG. 1A, an interlayer insulating layer 23 and a source electrode 19 are removed for showing an arrangement relationship among the gate electrodes 12 and 15, an n-type source region 7, and a $p^+$-contact region 8 (refer to FIGS. 8A and 8B).

As shown in FIG. 1A, the semiconductor device 100 includes an n-type drain layer 2 of a first semiconductor layer, a drift layer 3 of a second semiconductor layer, a gate electrode 12 of a first control electrode which is embedded within a trench 13 provided in the direction from the surface of the drift layer 3 toward the n-type drain layer, and a gate electrode 15 of a second control electrode provided on the drift layer 3.

The drift layer 3 includes n-type pillars 4 of first pillars and p-type pillars 5 of second pillars which are provided alternately in a direction along a major surface 2a of the n-type drain layer 2.

The gate electrode 12 is embedded within the trench 13 via a gate insulating layer 11 of a first insulating layer provided on the inner surface of the trench 13.

The gate electrode 15 is provided on the drift layer 3 via a gate insulating layer 14 of a second insulating layer provided on the surface of the drift layer 3.

On the surface of the drift layer 3, a p-type base region 6 of a first semiconductor region is provided except for a portion under the gate electrode 15. However, as shown in FIGS. 1A and 1B, the outer edge 6a of the p-type base region 6 along the gate electrode 15 may be extended under the gate electrode 15.

Furthermore, on the surface of the p-type base region 6, a n-type source region 7 of a second semiconductor region is provided. The n-type source region 7 is provided apart from the portion of the drift layer 3 under the gate electrode 15.

Then, by neighboring the n-type source region 7, the $p^+$-contact region 8 of a third semiconductor region is selectively provided on the surface of the p-type base region 6. The n-type source region 7 and the $p^+$-contact region 8 are electrically connected to the source electrode 19 which is not shown in the drawing.

In the semiconductor device 100 according to the embodiment, by applying a gate voltage to the gate electrode 12 embedded in the trench 13, it is possible to cause drain current to flow between a drain electrode 17 of a first major electrode electrically connected to the n-type drain layer 2 and the source electrode 19 of a second major electrode via an inversion channel formed at the interface between the p-type base region 6 and the gate insulating layer 11.

Meanwhile, at the gate electrode 15 provided on the drift layer 3, the n-type source region 7 is provided apart from the gate electrode 15 interposing a portion 8a of the $p^+$-contact region 8 therebetween, as shown in FIG. 1A. Therefore, even when an inversion channel is formed at the interface between a diffusion portion 6a of the p-type base region 6 formed under the gate electrode 15 and the gate insulating layer 14, the drain current does not flow under the gate electrode 15. Although the threshold voltage of the inversion channel formed under the gate electrode 15 becomes smaller than that formed between the gate electrode 12 and the p-type base region 6, it is possible to prevent the drain current from being concentrated at the gate electrode 15.

FIG. 1B is a plan view illustrating an arrangement relationship among the gate electrodes 12 and 15, the n-type pillar 4, and the p-type pillar 5 in the semiconductor device 100. The front cross-sectional structure of the perspective view shown in FIG. 1A schematically shows a cross section along the line Ia-Ia of FIG. 1B.

For example, the n-type pillars 4 and the p-type pillars 5 can be provided in a stripe shape extending in a direction along the major surface 2a of the drain layer 2. Then, as shown in FIGS. 1A and 1B, the gate electrode 12 can be provided in the trench 13 formed on the surface of the n-type pillar 4 in the extension direction of the n-type pillars 4 and the p-type pillars 5.

The gate electrodes 15 can be provided to form a ladder shape connecting the neighboring gate electrodes 12 to each other in a direction intersecting with the extension direction of the n-type pillars 4 and the p-type pillars 5. Then, the drift layer 3 covered by the gate electrode 15 includes a part of the p-type pillar 5.

As shown in FIG. 1B, the gate electrodes 15 are provided shifting the arrangement positions thereof alternately in the direction perpendicular to the extension direction of the p-type pillar 5.

Figure 2:
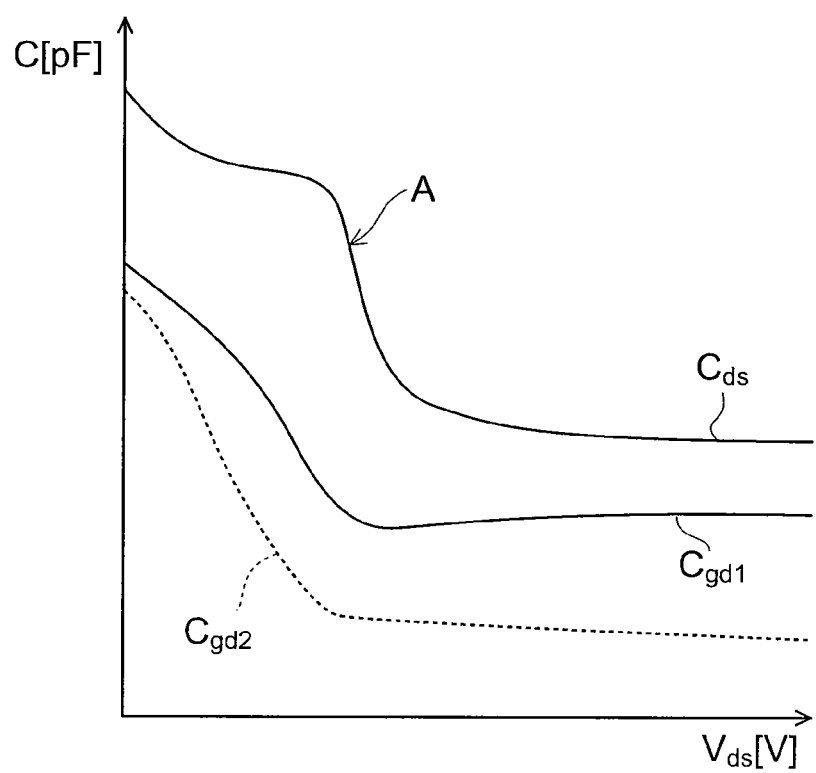
FIG. 2 is a graph conceptually illustrating voltage capacitance characteristics of the semiconductor device according to the first embodiment and a semiconductor device according to a comparative example.
Figure 14:
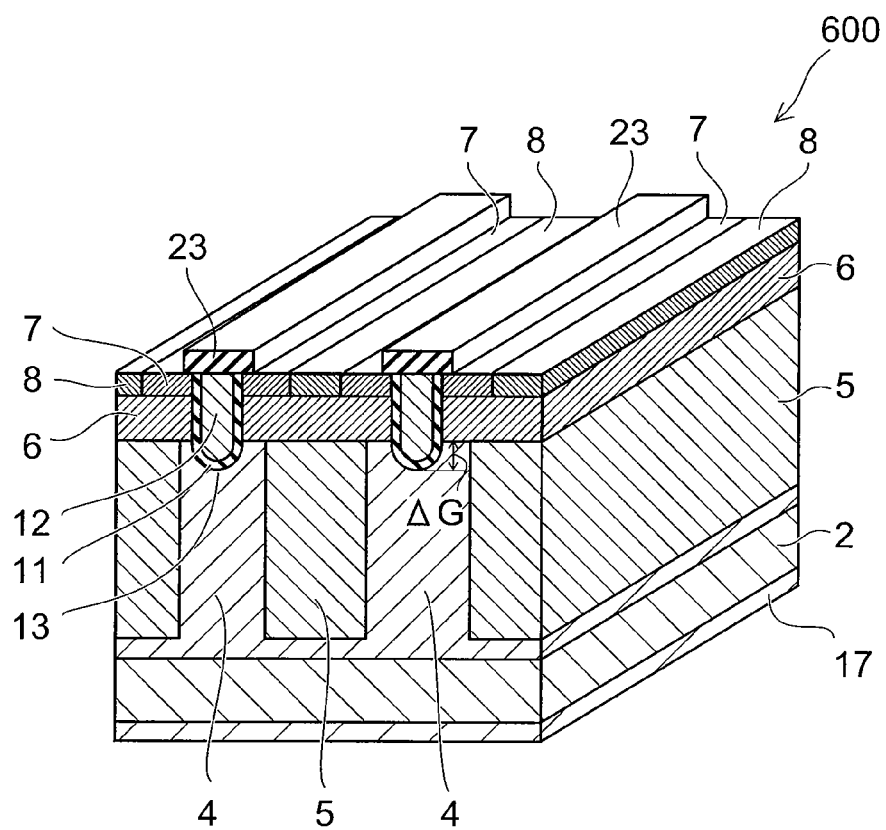
FIG. 14 is a perspective view schematically illustrating a semiconductor device according to the comparative example.

FIG. 2 is a graph conceptually showing voltage-capacitance characteristics of the semiconductor device 100 and a semiconductor device 600 according to a comparative example shown in FIG. 14, respectively. The vertical axis shows a capacitance value C and the horizontal axis shows a source-drain voltage $V_{ds}$.

$C_{ds}$ shown in FIG. 2 is a source-drain capacitance of the semiconductor device 100, $C_{gd1}$ is a gate-drain capacitance of the semiconductor device 100, and $C_{gd2}$ is a gate-drain capacitance of the semiconductor device 600 according to the comparative example.

For example, $C_{ds}$ decreases as $V_{ds}$ becomes higher, and in A region shown in FIG. 2, $C_{ds}$ becomes smaller abruptly. The decrease of $C_{ds}$ in the A region corresponds to a widening depletion region spreading into the n-type pillar 4 and p-type pillar from the p-n junction between the n-type pillar 4 and the p-type pillar 5. When the depletion region is spread across the whole drift layer 3, $C_{ds}$ approaches a minimum value and then shows a gradual decreasing trend as $V_{ds}$ increases.

In contrast to this, $C_{gd1}$ decreases as $V_{ds}$ is increased and is saturated when $C_{ds}$ moves into A region. After that, $C_{gd1}$ shows a tendency to increase gradually although $V_{ds}$ increases.

$C_{gd1}$ is a capacitance between the bottom portion of the gate electrode 12 embedded in the trench 13 and the drain electrode 17. $C_{dg1}$ decreases as the depletion layer is spread into the n-type pillar 4 from the p-n junction between the p-type base region 6 or the p-type pillar 5 and the n-type pillar 4 when $V_{ds}$ is applied across the source and the drain.

For example, in the semiconductor device 600 shown in FIG. 14, $V_{ds}$ is applied, and thus $C_{gd2}$ decreases at a high rate of change until the depletion layer is spread into the n-type pillar 4 and the p-type pillar 5, and almost the whole drift layer 3 becomes depleted. After that, the depletion layer spreading rate in the drift layer 3 decreases and $C_{gd2}$ shows a tendency to decrease gradually as $V_{ds}$ increases.

On the other hand, in the semiconductor device 100, the gate electrode 15 is provided on the drift layer 3 and the p-type base region 6 is not formed under the gate electrode 15. Therefore, when the depletion occurs in the p-type pillar 5 under the gate electrode 15, a portion of the gate electrode 15 facing the drain layer 2 via the p-type pillar 5 comes to face the drain layer 2 via the depletion layer. Then, the portion of the gate electrode 15 comes to newly contribute to $C_{gd1}$, and $C_{dg1}$ shows a tendency to increase as the increase of $V_{ds}$ after having decreased once.

The output capacitance of the semiconductor device 100 is a sum of the source-drain capacitance $C_{ds}$ and the gate-drain capacitance $C_{gd1}$. For example, if the semiconductor device 100 and the semiconductor 600 are different from each other in whether the gate electrode 15 exists or not, $C_{ds}$ of the semiconductor device 100 and the source-drain capacitance of the semiconductor device 600 can be considered to be the same. Accordingly, since $C_{gd1}$ is larger than $C_{gd2}$, the output capacitance of the semiconductor device 100 is larger than that of the semiconductor device 600. After the drain voltage $V_{ds}$ is increased and $C_{ds}$ decreases greatly, a difference between the output capacitance of the semiconductor device 100 and that of the semiconductor device 600 becomes further large.

For example, when each of the semiconductor device 100 and the semiconductor device 600 has performed switching operation, the drain voltage change rate (dV/dt) thereof is inversely proportional to the output capacitance. Accordingly, the drain voltage change rate of the semiconductor device 100 is smaller than that of the semiconductor device 600. Since the switching noise is proportional to the drain voltage change rate, the semiconductor device 100 has a lower noise than the semiconductor device 600.

That is, the semiconductor device 100 has a configuration in which the gate electrode 15 is provided on the drift layer 3 and the p-type base region 6 is not provided under the gate electrode 15. Thereby, it becomes possible to increase the gate-drain capacitance $C_{gd1}$ and to reduce the switching noise.

Also in the semiconductor device 600 shown in FIG. 14, it is possible to increase the gate-drain capacitance $C_{gd2}$ by increasing a protrusion amount ΔG of the lower portion of the gate electrode 12 which protrudes toward the drain layer 2 from the boundary between the p-type base region 6 and the n-type pillar 4.

However, in a case where ΔG is made larger and the bottom portion of the gate electrode 12 is protruded into the n-type pillar 4, the gate insulating layer 11 at the bottom portion of the trench 13 comes to be exposed to a high electric field when the drift layer 3 has been depleted and the high electric field has been induced in the n-type pillar 4. Then, hot carriers accelerated by the high electric field is injected into the gate insulating layer 11, sometimes resulting in a degradation of reliability depending on insulation capability in the gate insulating layer 11.

In contrast to this, in the semiconductor device 100 according to the embodiment, it is possible to increase the gate-drain capacitance by providing the gate electrode 15. Therefore, it is possible to improve the reliability by reducing the protrusion amount of the gate electrode 12 into the n-type pillar 4.

Under the gate electrode 15A, the depletion region is spread up to the surface of the drift layer 3, contacting the gate insulating layer 14. However, since the portion of the n-type pillar 4 directly under the gate electrode 15 is sandwiched by the p-type base regions 6 which are to be kept at a low potential, a lower electric filed is induced therein than in the center of the drift layer 3. Accordingly, the hot carriers are not injected into the gate insulating layer 14 and the insulation capability of the gate insulating layer 14 is maintained.

Next, a manufacturing process of the semiconductor device 100 will be explained with reference to FIGS. 3A and 3B to FIGS. 8A and 8B.

Figure 3A:
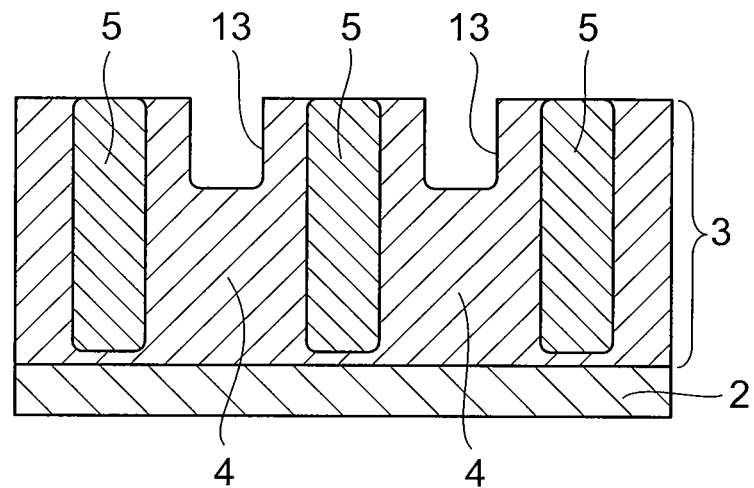
FIGS. 3A to 8B are schematic cross sectional views illustrating a manufacturing process of the semiconductor device according to the first embodiment and the views denoted by A show a cross section along the line Ia-Ia and the views denoted by B show a cross section along the line IVb-IVb in FIG. 1.
Figure 3B:
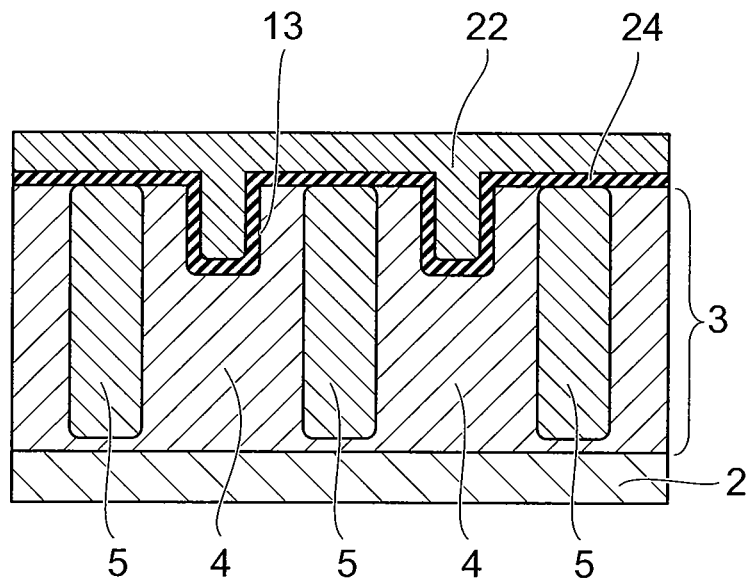

FIG. 3A is a schematic view showing a cross section along the line Ia-Ia of FIG. 1 and shows a state in which the trench 13 is formed on the surface of the drift layer 3 provided on the n-type drain layer 2.

The n-type drain layer 2 and the drift layer 3 can be provided on a silicon substrate, for example. A silicon layer in which n-type impurities are doped in high concentration can be used as the n-type drain layer 2. The drift layer 3 includes the super junction structure configured with the n-type pillar 4 and the p-type pillar 5.

The super junction structure can be formed by forming a trench on the surface of the n-type silicon layer having a lower concentration than the n-type drain layer 2 by using a RIE (Reactive Ion Etching) method and subsequently growing p-type silicon epitaxially within the trench, for example.

Next, a conduction layer 22 for providing the gate electrodes 12 and 15 via an insulating layer 24 is formed on the surface of the drift layer 3 provided with the trench 13.

For example, a silicon oxide film ($SiO_2$ film) formed by thermal oxidation can be used as the insulating layer 24 which functions as the gate insulating layer 11 and 14.

A poly-silicon layer formed by using a CVD (Chemical Vapor Deposition) method, for example, can be formed as the conduction layer 22.

Figure 4A:
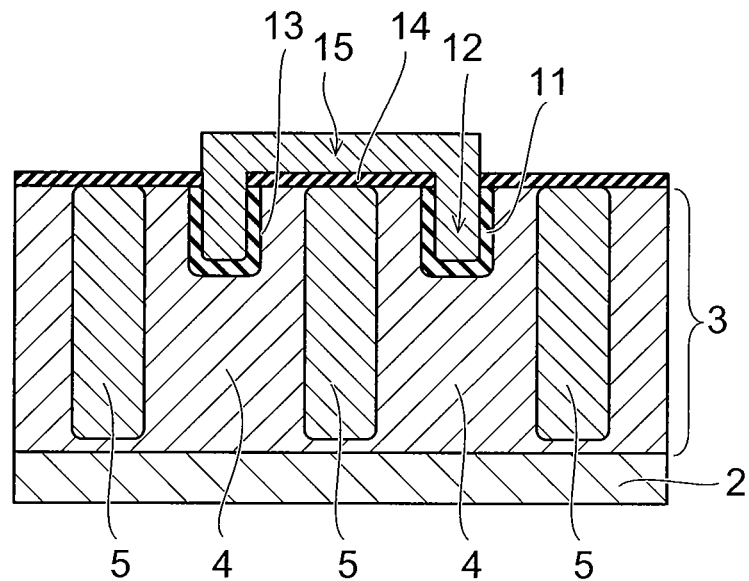
Figure 4B:
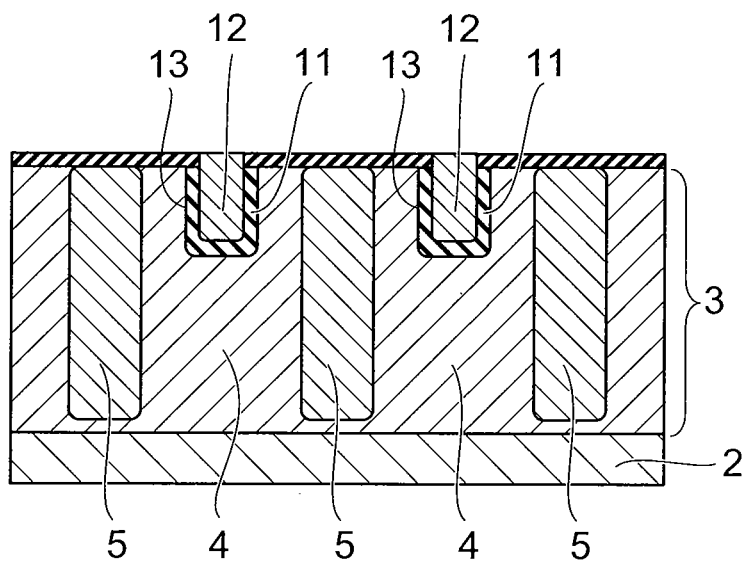

FIGS. 4A and 4B are schematic views illustrating a manufacturing process continuous with that in FIG. 3 and show a state in which the conduction layer 22 are formed into patterns of the gate electrodes 12 and 15.

Here, FIG. 4A shows a cross-sectional structure along the line Ia-Ia of FIG. 1B and FIG. 4B shows a cross-sectional structure along the line IVb-IVb. Hereinafter, the same applies to the drawings up to FIGS. 8A and 8B.

For example, as shown in FIG. 4B, the conduction layer 22 on the drift layer 3 is etched off, leaving the portion embedded within the trench 13. Therefore, the gate electrode 12 is formed as a so-called trench gate.

Meanwhile, the conduction layer 22 on the drift layer 3 is selectively etched off and the gate electrode 15 can be provided connecting the neighboring gate electrodes 12 to each other as shown in FIG. 4A.

Next, boron (B), for example, which is a p-type impurity, is ion-implanted into the surface of the drift layer 3 provided with the gate electrodes 12 and 15, and the p-type base region 6 is formed.

Figure 5A:
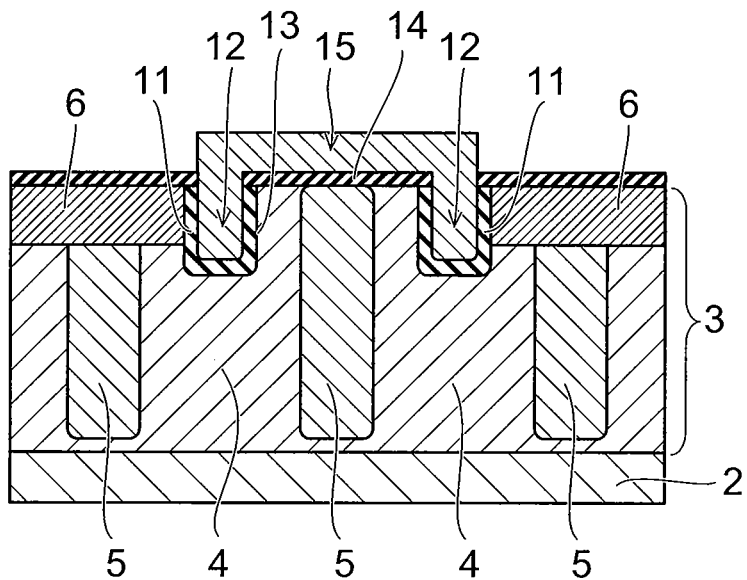
Figure 5B:
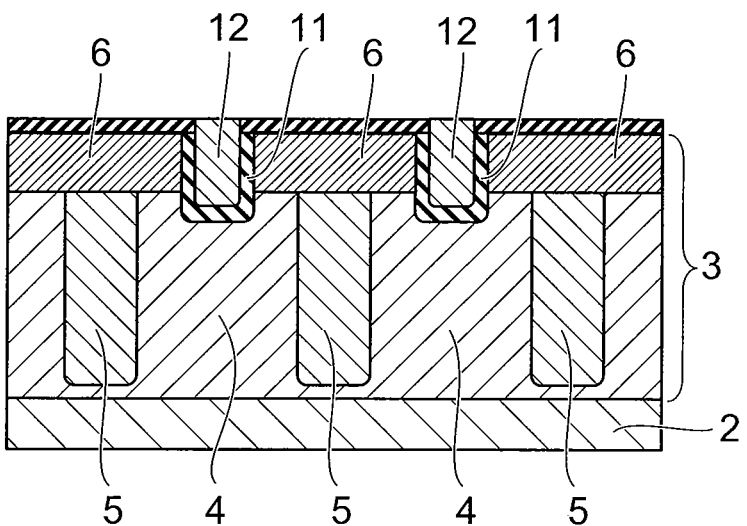

As shown in FIGS. 5A and 5B, the p-type region 6 is formed in the surface of the drift layer 3, where the boron is ion-implanted, except the portion covered by the gate electrode 15.

Figure 6A:
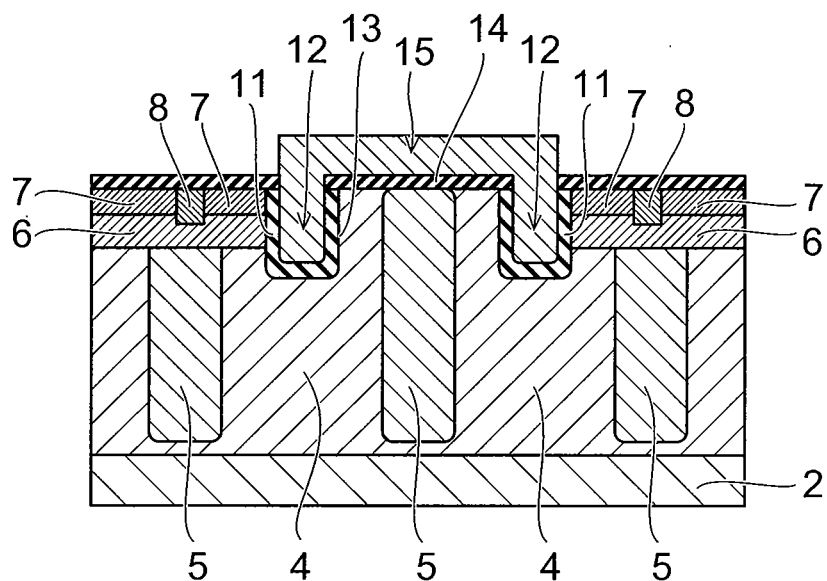
Figure 6B:
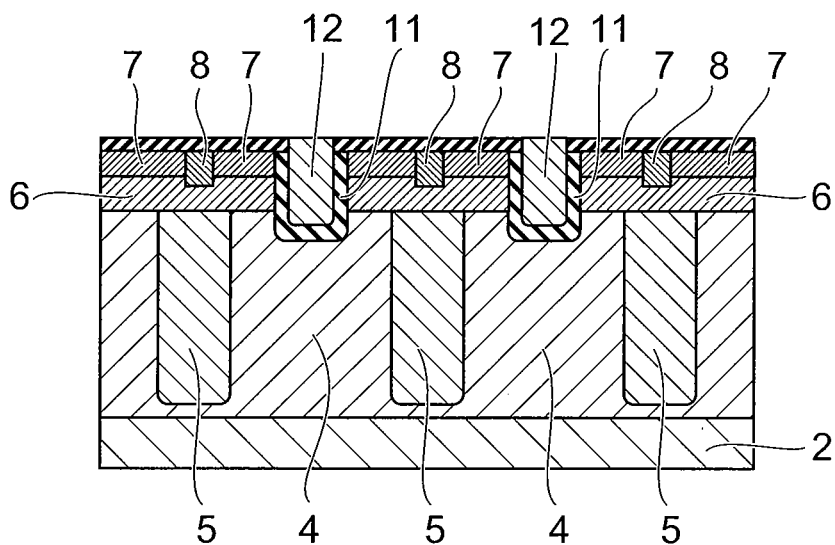

Subsequently, as shown in FIGS. 6A and 6B, the n-type source region 7 is formed in the surface of the drift layer 3 where arsenic (As), for example, which is an n-type impurity, is selectively ion-implanted. Furthermore, the $p^+$-contact region 8 is selectively formed, where the boron (B) is additionally ion-implanted As shown in FIG. 6A, the n-type source region 7 and the $p^+$-contact region 8 are provided on the surface of the drift layer 3 in a region except the portion covered by the gate electrode 15. As shown in FIG. 6B, in the region where the gate electrode 15 is not provided, a MOSFET is formed having the same trench gate structure as in the semiconductor device 600 shown in FIG. 14.

Figure 7A:
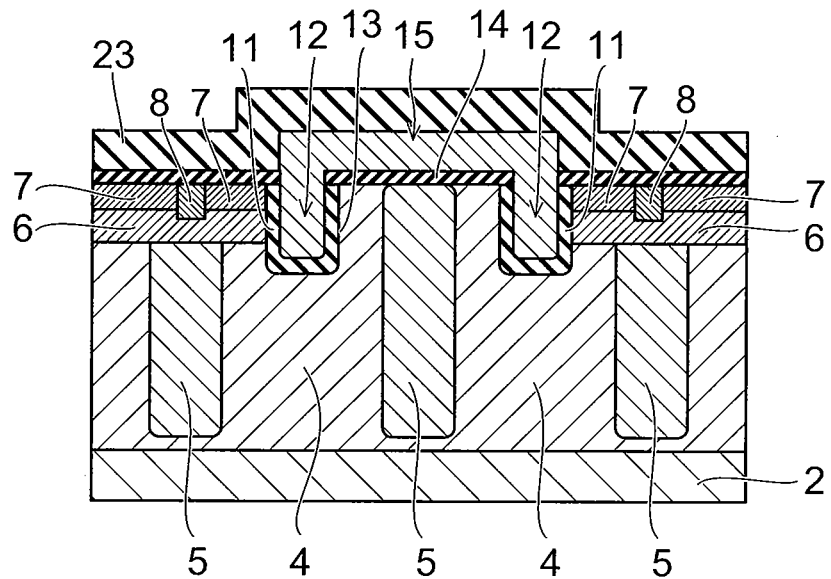
Figure 7B:
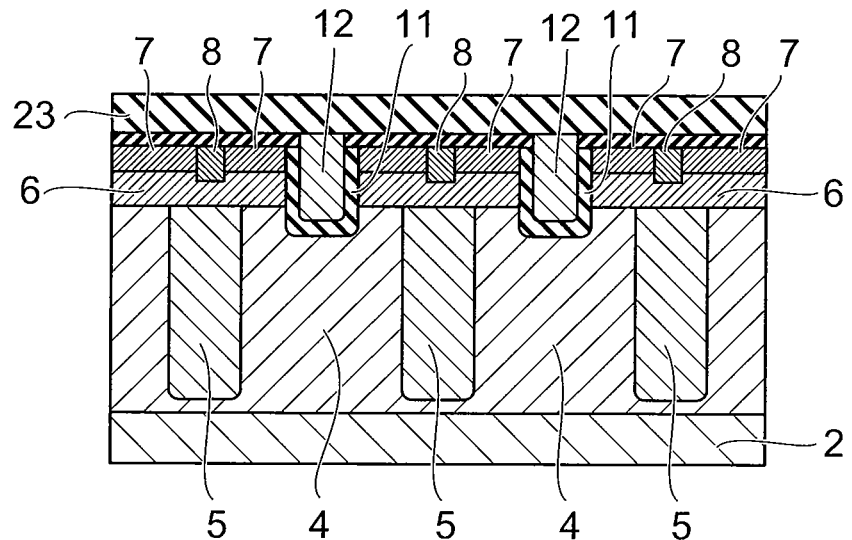

Next, as shown in FIGS. 7A and 7B, the insulating layer 23 is formed as an interlayer insulating film on the gate electrode 12, the gate electrode 15, the n-type source region 7, and the $p^+$-contact region 8.

A $SiO_2$ film formed by using the CVD method, for example, can be used as the insulating layer 23.

Figure 8A:
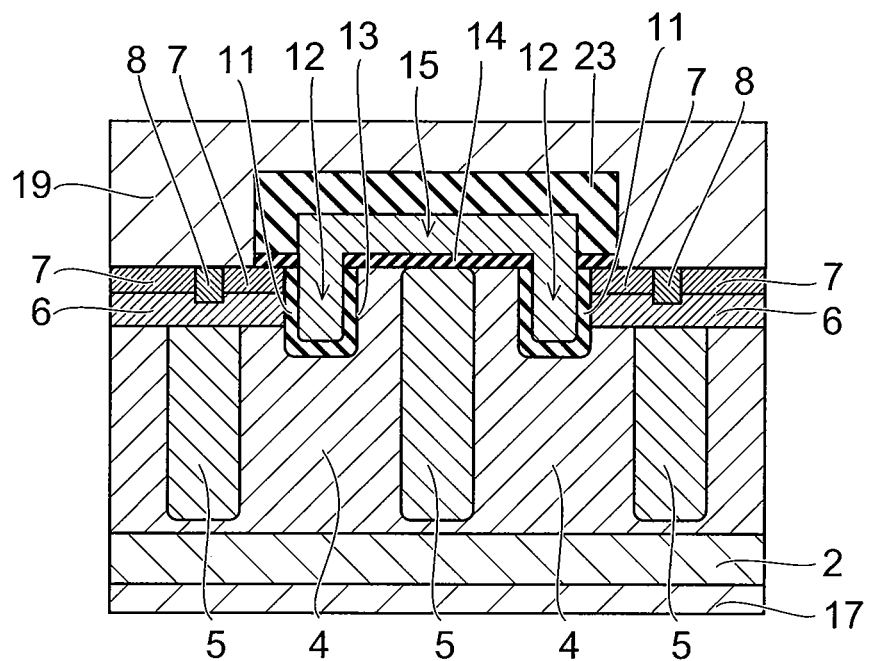
Figure 8B:
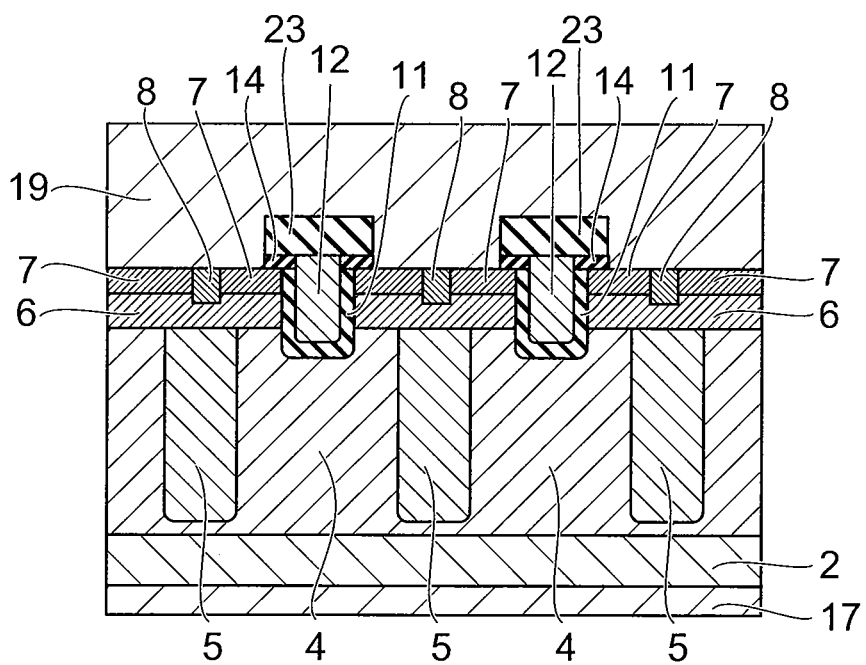

Subsequently, as shown in FIGS. 8A and 8B, leaving the portions on the gate electrodes 12 and 15, the insulating layer 24 and 23 on the n-type source region 7 and the $p^+$-contact region 8 are selectively etched off.

After that, the source electrode 19 is formed on the gate electrodes 12 and 15 covered by the insulating layer 23 and on the surface of the n-type source region 7 and the $p^+$-contact region 8.

Furthermore, the drain electrode 17 electrically connected to the n-type drain layer 2 is formed and the structure of the semiconductor device 100 can be completed.

Figure 9:
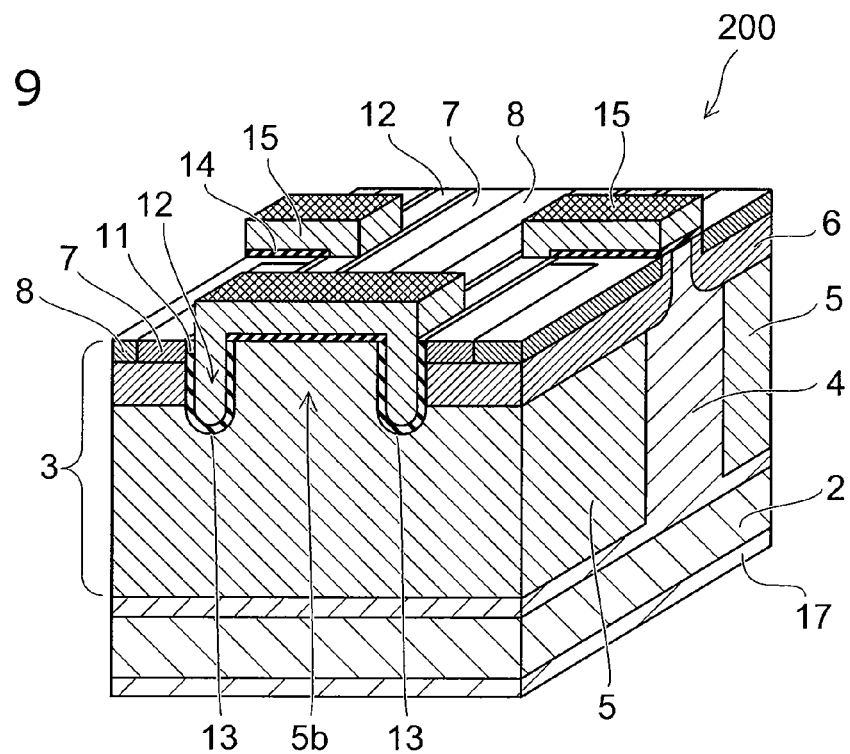
FIG. 9 is a perspective view schematically illustrating a semiconductor device according to a variation of the first embodiment.

FIG. 9 is a perspective view schematically showing a structure of a semiconductor device 200 according to a variation of the first embodiment.

The semiconductor device 200 is different from the semiconductor device 100 in a point where the extension direction of the n-type pillars 4 and the p-type pillars 5 provided in a stripe shape and the extension direction of the gate electrode 12 embedded in the trench 13 perpendicularly intersect with each other.

In the semiconductor device 200, for example, there is a portion 5b, under the gate electrode 15, occupied by a part of the p-type pillar 5 and the portion 5b does not contribute to the gate-drain capacitance $C_{gd}$ until the p-type pillar 5 is depleted. Then, as shown in FIG. 2, when the p-type pillar 5 has been depleted and the whole drift layer 3 has become a depletion layer, the portion 5b under the gate electrode 15 starts to contribute to $C_{gd}$ and increases $C_{gd}$ as the increase of the drain voltage $V_{ds}$.

Figure 10:
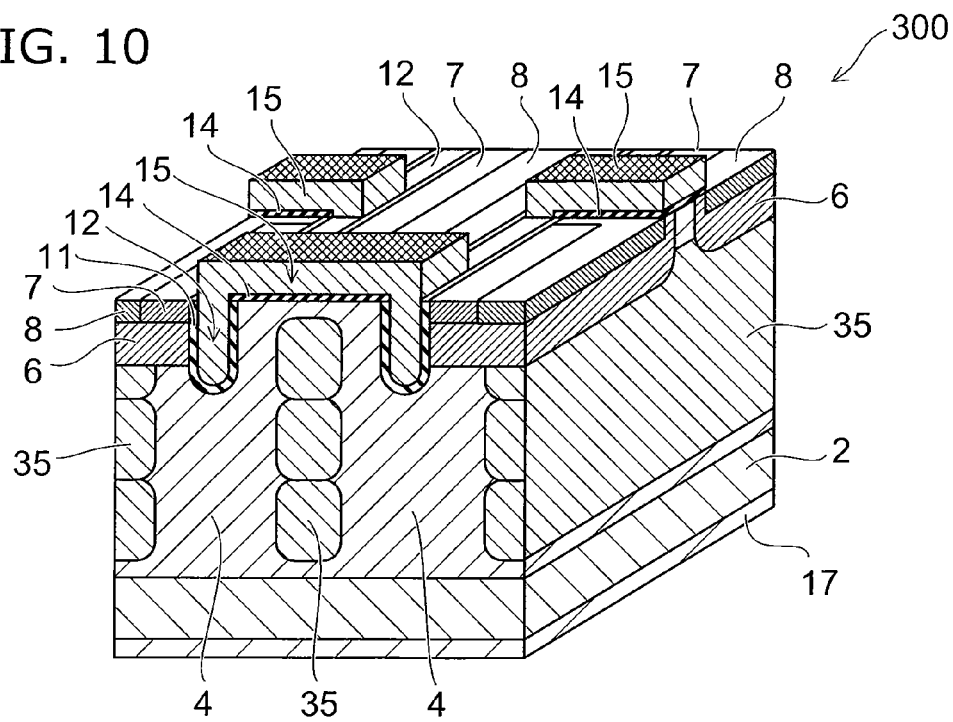
FIG. 10 is a perspective view schematically illustrating a semiconductor device according to another variation of the first embodiment.

FIG. 10 is a perspective view schematically showing a structure of a semiconductor device 300 according to another variation of the first embodiment.

In the semiconductor device 300, the manufacturing method of a p-type pillar 35 is different from that of the p-type pillar 5 in the semiconductor device 100. For example, the p-type pillar 35 can be formed by providing a high resistance epitaxial layer with selectively ion-implanted n-type and p-type impurities, stacking another high resistance epitaxial layer thereon after diffusing the impurities by heat treatment, and repeating the processes of the ion implantations of the n-type and the p-type impurities and the heat treatment. That is, the p-type pillar 35 can be formed by repeating the epitaxial growth, the ion implantations and the heat treatment.

FIGS. 11A to 11C are plan views showing gate electrode arrangements according to the variations of the first embodiment.

As shown in FIG. 11A, the gate electrodes 15 can be provided in a stripe shape so as to intersect with the extension direction of the gate electrode 12, the n-type pillar 4, and the p-type pillar 5.

As shown in FIG. 11B, the gate electrodes 12 may be provided on both sides of the p-type pillar 5 and the gate electrode 15 may be provided so as to connect the gate electrodes 12 to each other across the n-type pillar 4. In this case, the p-type pillar 5 is not provided under the gate electrode 15 and thus the gate electrode 15 contributes directly to the gate-drain capacitance $C_{gd}$.

Moreover, the gate electrodes 12 can be provided at plural parts which are apart from each other in a direction along the surface of the drift layer 3. Then, the gate electrode 15 is provided on a portion where the plural parts of the gate electrodes 12 are apart from each other, so as to connect the parts to each other. As a result, the gate electrodes 12 and the gate electrodes 15 are provided as alternately connected in series.

In an example shown in FIG. 11C, the gate electrodes 12 are provided on both sides of the p-type pillar 5 so as to be apart from each other in the extension direction of the p-type pillar 5. The gate electrode 15 includes a part connecting the neighboring gate electrodes 12 to each other across the n-type pillar 4 (first connection part 15b) and a part bridging a separation part ΔU between the gate electrodes 12 (second connection part 15a). Then, the gate electrodes 12 and the gate electrodes 15 are provided in series in the extension direction of the n-type pillar 4 and the p-type pillar 5. As shown in FIG. 11C, the second connection part 15a connects the first connection parts 15b, which is apart from each other above the n-type pillar 4, to each other and electrically connects the plural parts of the gate electrode 12 to each other.

Figure 12A:
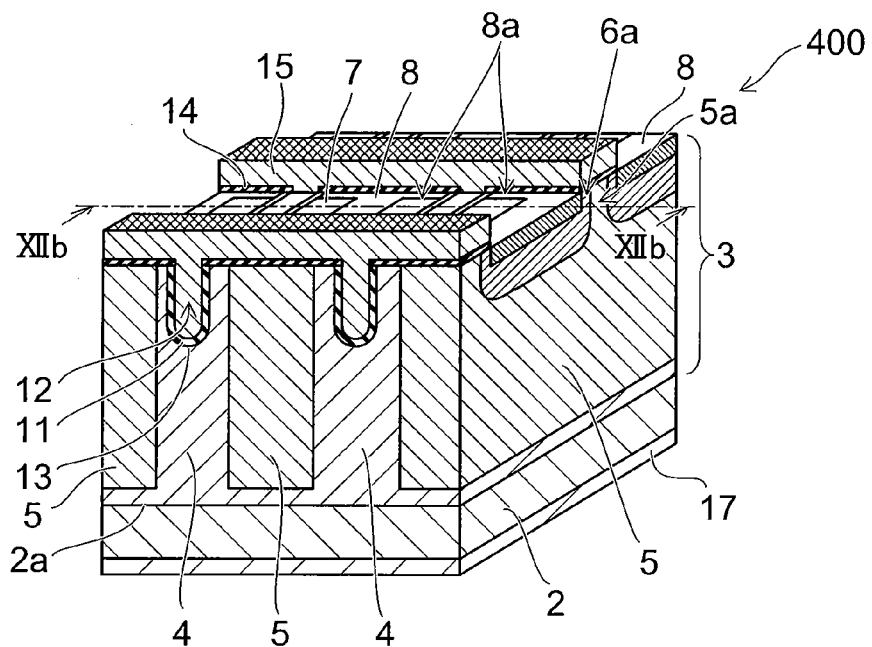
FIGS. 12A and 12B are schematic views illustrating a semiconductor device having the gate electrode arrangement shown in FIG. 11A.
Figure 12B:
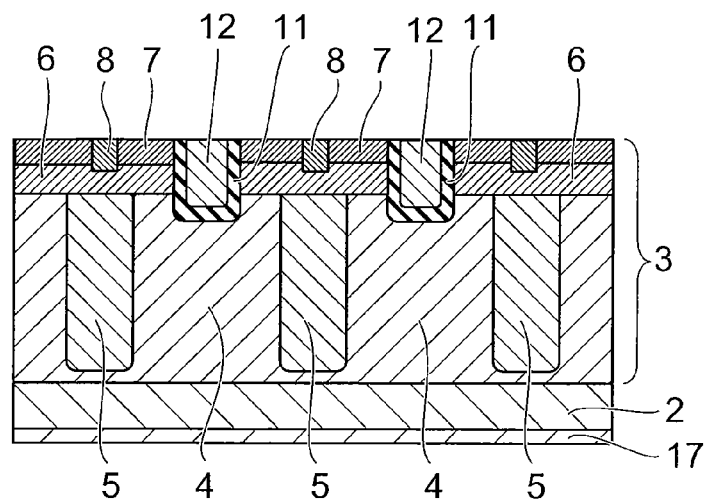

FIGS. 12A and 12B are schematic views showing a semiconductor device 400 having the gate electrode 15 shown in FIG. 11A. FIG. 12A is a perspective view schematically illustrating a structure of the semiconductor device 400 and FIG. 12B is a schematic view illustrating a cross-sectional structure along the line XIIb-XIIb.

In the semiconductor device 400, the n-type pillars 4 and the p-type pillars are provided in a stripe shape, and also the gate electrodes 15 are provided in a stripe shape intersecting with the plural n-type pillars 4 and the p-type pillars 5. As shown in FIGS. 12A and 12B, the gate electrodes 12 are provided on the surface of the n-type pillar 4 in the extension direction thereof. The gate electrode 15 intersects with the plural gate electrodes 12 and is electrically connected to the gate electrodes 12 at the intersection points. Then, the p-type base region 6 is not provided under the gate electrode 15 and thus the gate electrodes 15 faces the respective surfaces of the plural n-type pillars 4 and p-type pillars 5 via the gate insulating layer 11.

Therefore, as compared with the case in which the p-type base region 6 is formed under the gate electrode 15, the gate-drain capacitance $C_{gd}$ becomes larger. Furthermore, a reverse bias is applied to the p-n junction between the n-type pillar 4 and the p-type pillar 5, and the gate-drain capacitance $C_{gd}$ is also increased when the n-type pillar 4 and the p-type pillar 5 are depleted.

The p-type base region 6 is provided on the surface of the drift layer 3 between the neighboring gate electrodes 15. Then, the n-type source region 7 and the p$^+$-contact region 8 are selectively provided on the surface thereof. The n-type source region 7 faces a side face of the gate electrode 12 via the gate insulating layer 11. The p$^+$-contact region 8 is provided so as to be connected to the p-type base region 6 and keeps the p-type base region 6 and the source electrode 19 at the same potential (refer to FIG. 8B).

As shown in FIG. 12A, the n-type source region 7 is provided apart from the drift layer 3 under the gate electrode 15. That is, as shown in the same drawing, a portion 8a of the p$^+$-contact region 8 exists between the n-type source region 7 and the gate electrode 15 and separates the outer edge (diffusion portion) 6a of the p-type base region 6 extending under the gate electrode 15 from the n-type source region 7. Therefore, the drain current flowing through an inversion layer formed under the gate electrode 15 is suppressed and current concentration is avoided. That is, if the n-type source region 7 is connected to the outer edge (diffusion portion) 6a of the p-type base region 6, the drain current flows through the inversion layer which is formed under the gate electrode 15. Since the outer edge has a low threshold voltage, there may arise a problem of the current concentration.

As described above, in the first embodiment, the gate electrode 15 electrically connected to the gate electrode 12 is provided on the surface of the drift layer 3 via the gate insulating layer 11. Then, the p-type base region is not provided under the gate electrode 15 and thus the gate-drain capacitance is increased to thereby reduce the switching noise. Furthermore, the n-type source region 7 is formed apart from the gate electrode 15 and the current flowing in the inversion layer having a low threshold voltage under the gate electrode 15 is suppressed. Therefore, the drain current flows in the trench gate including the gate electrode 12 and the current concentration is alleviated.

(Second Embodiment)

Figure 13A:
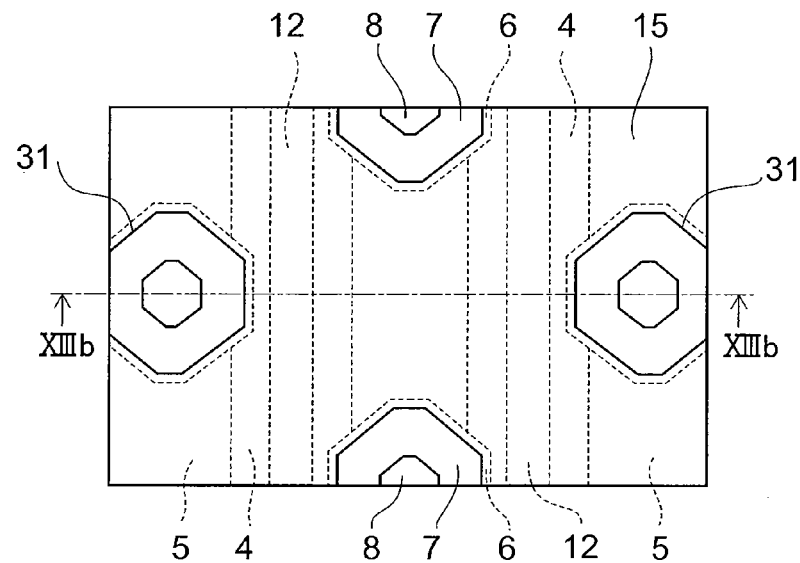
FIGS. 13A and 13B are schematic views illustrating a semiconductor device according to a second embodiment.
Figure 13B:
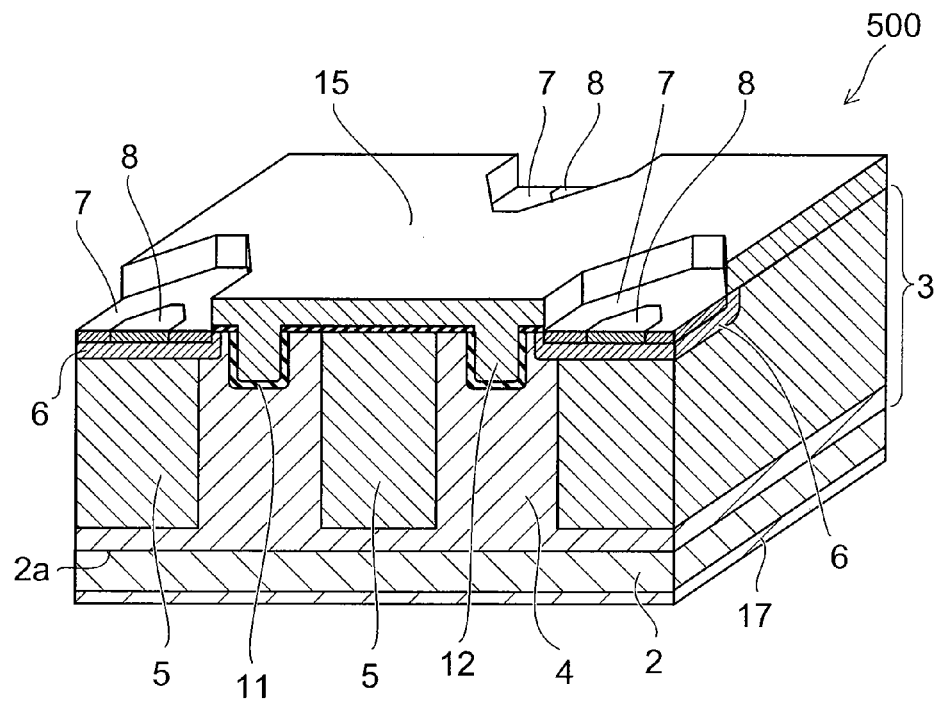

FIGS. 13A and 13B are schematic views showing a structure of a semiconductor device 500 according to a second embodiment. FIG. 13A is a plan view showing a part of a chip surface in the semiconductor device 500 except the source electrode 19 and the insulating layer 23 (refer to FIGS. 8A and 8B). FIG. 13B is a perspective view schematically showing a structure of the semiconductor device 500.

In the semiconductor device 500, the gate electrode 12 is provided on the surface of the n-type pillar 4 along the extension direction thereof. Then, the gate electrode 15 is formed on the almost whole surface of the drift layer 3, which is provided with the n-type pillar 4 and the p-type pillar 5, via the gate insulating layer 11.

The p-type base region 6 is provided so as to be dotted on the surface of the drift layer 3 in a plan view parallel to the major surface 2a of the n-type drain layer 2. Then, the gate electrode 15 is provided with plural openings 31 each passing through from the surface thereof to the p-type base region 6.

Furthermore, the n-type source region 7 and the $p^+$-contact region 8 that neighbors the n-type source region 7 are selectively provided on the surface of the p-type base region 6 which forms the bottom surface of the opening 31. The p-type base region 6 is provided on the p-type pillar 5. Then, the $p^+$-contact region 8 is formed so as to be connected to the p-type base region 6.

In the semiconductor device 500, when a gate voltage is applied, an inversion layer is formed on the surface of the p-type base region 6 facing the gate electrode 15 via the gate oxide film 11 and the drain current flows between the source electrode and the drain electrode 17 via the inversion layer. Furthermore, an inversion layer is formed also on the surface of the p-type pillar 5 facing the gate electrode 15 via the gate oxide film 11 and the drain current also flows via the inversion layer on the surface of the p-type pillar 5. Therefore, the drain current flows in the whole n-type pillar 4 via the inversion layers and the on-resistance is reduced.

In contrast, the gate electrode 12 is provided on the surface of the n-type pillar 4 and the gate-drain capacitance $C_{gd}$ becomes larger than that in a simple planar gate structure. Therefore, the output capacitance can be increased to reduce the switching noise.

As shown in the above embodiments, the gate electrodes 12 and 15 can be provided appropriately in a preferable manner based on a configuration of the n-type pillar 4 and the p-type pillar and a desired gate-drain capacitance $C_{gd}$.

While the example of providing the n-type pillars 4 and the p-type pillars 5 in a stripe shape has been explained in the above embodiments, the embodiment is not limited to this example and can be applied to a super junction structure configured in a grid shape, a dot arrangement, or the like. Then, while the configuration of the trench gate has been also explained for the example of providing the trench gates in a stripe shape, the configuration is not limited to this example as far as the configuration accords with the gist of the embodiments in which a trench gate structure and a planar gate structure are combined together in order to increase the gate-drain capacitance.

While, as described above, the invention has been explained with reference to embodiments according to the invention, the invention is not limited to these embodiments. For example, an embodiment having the same technical concept as the invention such as design change and material change which can be performed by one skilled in the art on the basis of a technical level at the time of the application is also included in the technical range of the invention.

While, in the above embodiments, a vertical-type power MOSFET using silicon as a material has been explained as an example, the embodiment can be applied to any structure as far as the structure is a MOS gate structure and a structure having an n-type pillar and a p-type pillar. For example, the embodiment can be applied to another switching device such as a lateral-type device and an IGBT. The material is not limited to silicon and the embodiment can provide the similar effects also when applied to a material such as SiC and GaN.

What is claimed is:

1. A semiconductor device, comprising:
a semiconductor layer having a first conductivity type;
a first control electrode extending within the semiconductor layer from a surface of the semiconductor layer;
a first insulating layer provided between the first control electrode and the semiconductor layer;
a second control electrode provided on the semiconductor layer, and electrically connected to the first control electrode;
a second insulating layer provided between the second control electrode and the semiconductor layer;
a first semiconductor region of a second conductivity type selectively provided in the semiconductor layer at the surface of the semiconductor layer except for a portion of the semiconductor layer under the second control electrode;
a second semiconductor region of the first conductivity type provided selectively in the first semiconductor region at a surface of the first semiconductor region and in contact with the first insulating layer;
a third semiconductor region of the second conductivity type and provided selectively in the first semiconductor region at the surface of the first semiconductor region and adjacent to the second semiconductor region, part of the third semiconductor region being provided between the second semiconductor region and the portion of the semiconductor layer under the second control electrode;
a first electrode connected electrically to the semiconductor layer; and
a second electrode connected electrically to the second semiconductor region and the third semiconductor region.

2. The device according to claim 1, wherein
the first control electrode is provided in a stripe shape along the surface of the semiconductor layer, and
the second control electrode extends in a direction intersecting the first control electrode.

3. The device according to claim 2, further comprising:
a plurality of first control electrodes, and
a plurality of second control electrodes, wherein the second control electrodes are provided between the first control electrode adjacent to each other so as to be disposed in a ladder shape.

4. The device according to claim 3, wherein
the second control electrodes are disposed in a direction perpendicular to an extension direction of the first control electrode with an arrangement alternately shifted in the extension direction.

5. The device according to claim 1, further comprising
a plurality of second control electrodes,
wherein the first control electrode includes plural parts apart from each other in a first direction along the surface of the semiconductor layer;
the second control electrodes electrically connect the plural parts of the first control electrode to each other; and
the plural parts of the first control electrode and the second control electrodes are disposed in series.

6. The device according to claim 5, further comprising:
a plurality of first control electrodes arranged in parallel in a second direction perpendicular to the first direction in the surface of the semiconductor layer,
wherein each of the first control electrodes includes plural parts apart from each other in the first direction, and each of the second control electrodes includes a pair of first connection parts and a second connection part provided between the pair of first connection parts and electrically connecting the pair of first connection parts, each first connection part electrically connecting plural parts of the first control electrodes adjacent to each other in the second direction.

* * * * *